(12) United States Patent
Iyer et al.

(10) Patent No.: US 6,383,723 B1
(45) Date of Patent: *May 7, 2002

(54) METHOD TO CLEAN SUBSTRATE AND IMPROVE PHOTORESIST PROFILE

(75) Inventors: Ravi Iyer; Ardavan Niroomand, both of Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/141,902

(22) Filed: Aug. 28, 1998

(51) Int. Cl.$^7$ ................................................. G03F 7/00
(52) U.S. Cl. ........................ 430/327; 430/950; 134/1.3; 134/3
(58) Field of Search ................................ 430/311, 322, 430/327, 950; 134/1.3, 3; 216/99

(56) References Cited

U.S. PATENT DOCUMENTS

| | | | | |
|---|---|---|---|---|
| 4,046,620 A | * | 9/1977 | Andrascek et al. | 314/3 |
| 4,740,410 A | | 4/1988 | Muller et al. | 428/133 |
| 5,032,218 A | * | 7/1991 | Dobson | 156/642 |
| 5,252,881 A | | 10/1993 | Muller et al. | 310/309 |
| 5,294,570 A | * | 3/1994 | Fleming | 437/239 |
| 5,637,151 A | * | 6/1997 | Schulz | 134/2 |
| 5,759,746 A | * | 6/1998 | Azuma et al. | 430/313 |
| 5,759,747 A | | 6/1998 | Dohmen et al. | 430/313 |
| 5,879,863 A | * | 3/1999 | Azuma et al. | 430/322 |

OTHER PUBLICATIONS

Takashi Hattori et al, Delay–Free Deprotection Approach to Robust Chemically Amplified Resist, Journal of Photopolymer Science and Technology, vol. 9, No. 4, 1996 (pp. 611–618).

Shigeyasu Mori et al, Substrate–Effect of Chemically Amplified Resist, Journal of Photopolymer Science and Technology, vol. 9, No. 4, 1996, pp. 601–610.

Byeong–Chan Kim et al, Substrate Effects of Silicon Nitride on I–Line and Deep–UV Lithography, SPIE, vol. 2724, pp. 119–130, 1996.

Kim R. Dean et al, Investigation of Deep Ultraviolet Photoresists on TiN Substrates, Sematech, SPIE, vol. 2438, pp. 514–528, 1995.

John Sturtevant et al, Substrate Contamination Effects in the Processing of Chemically Amplified DUV Photoresists, SPIE, vol. 2197, pp. 770–780, 1994.

* cited by examiner

*Primary Examiner*—Kathleen Duda
(74) *Attorney, Agent, or Firm*—Dickstein Shapiro Morin & Oshinsky LLP

(57) ABSTRACT

A method for reducing defects in the profiles of chemically amplified photoresists used in deep ultraviolet (DUV) and laser lithography. Chemically amplified resists are typically highly sensitive to nitrogen-bearing surface contaminants, and photoresist layers formed on contaminated surfaces exhibit profile defects such as resist footing and T-topping. These defects are reduced by pretreating the surface of a semiconductor device or other structure with a cleansing etchant prior to the formation of the photoresist layer. The cleansing etchant is a solution of sulfuric acid and an oxidizing agent known as "piranha."

43 Claims, 2 Drawing Sheets

METHOD TO CLEAN SUBSTRATE AND IMPROVE PHOTORESIST PROFILE

FIELD OF THE INVENTION

The present invention relates to the fabrication of semiconductor devices and more particularly to a method for cleaning a semiconductor substrate prior to the formation of a chemically amplified photoresist layer thereon.

BACKGROUND OF THE INVENTION

The importance of minimizing contamination during semiconductor fabrication processes has been recognized since the early days of the industry. As semiconductor devices have become smaller and more complex, cleanliness requirements have become increasingly stringent, especially for devices with submicron critical dimensions. Cleanliness is especially important during the application of photoresist layers, because contaminants may lead to defects in the photoresist ("resist") profile that then result in slopy etching and poor line definition. In particular, if the profile exhibits defects at its base that result in an abnormal (other than 90 degree) intersection between the resist and the substrate, an etch performed with the defective resist will not produce straight-walled structures, and may result in inoperability of the semiconductor structure.

Poor resist profiles are especially prevalent in chemically amplified resists ("CA resists") used for microlithography. Traditional resists based on pheno-formaldehyde polymers (novolac resins) do not work well with DUV and laser lithography because they cannot be tuned to respond to the short wavelengths of DUV and laser light (~300 nm). Chemically amplified resists contain photoacid generators (PAGs) to increase the photosensitivity of the resist. Development of CA resists depends on the catalytic action of the PAG, and if acid loss (neutralization) occurs, profile abnormalities will result due to areas of incomplete solubility.

Acid loss at the top of the resist profile (the resist/air interface) leads to a bulge in the profile known as a T-top or cap due to reactions with bases adsorbed from the air. Acid loss at the bottom of the resist profile (the resist/substrate interface) leads to profile abnormalities such as resist footing on positive resists, and undercutting on negative resists. The acid loss is believed to be due to the presence of nitrogen-containing compounds such as atmospheric ammonia or ammonium ion which neutralize the photoacid, resulting in incomplete solubility of the resist. It is known that the presence of organic compounds such as amines in concentrations as low as 100 ppb adversely affects the stability of some CA resists.

Methods for reducing the amount of nitrogen-containing compounds on a CA resist substrate have included the use of a barrier layer such as an anti-reflective coating, treatment with oxygen plasma, and increasing the exposure dose. While use of these known methods produces some improvement over an untreated substrate, significant profile defects are still evident.

There is needed, therefore, a method for reducing resist profile defects when a chemically amplified resist such as a DUV resist is formed. In particular, a method for reducing contamination on the substrate before the formation of a CA photoresist layer is needed.

SUMMARY OF THE INVENTION

The present invention provides a method for reducing resist profile defects by reducing contamination on a substrate before the formation of a CA photoresist layer. A substrate provided with a first layer to be etched and an anti-reflective coating layer is exposed to a cleansing etchant to remove contaminants prior to the formation of a CA photoresist layer thereon. The cleansing etchant is a solution of sulfuric acid and an oxidizing agent, which may be hydrogen peroxide, ammonium persulfate, potassium persulfate, or the like. The cleansing etchant is known in the chemical arts as "piranha" or Caro's acid. After treatment with the cleansing etchant for a predetermined time at an elevated temperature, a CA photoresist layer is then applied to the substrate.

Advantages and features of the present invention will be apparent from the following detailed description and drawings which illustrate preferred embodiments of the invention.

DETAILED DESCRIPTION OF THE PREFERRED EMBODIMENT

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention.

The terms wafer or substrate used in the following description include any semiconductor-based structure having an exposed layer to be etched using the improved photoresist produced by the process of this invention. Wafer and substrate are to be understood as including silicon-on-insulator, doped and undoped semiconductors, epitaxial layers of silicon supported by a base semiconductor foundation, and other semiconductor structures. Furthermore, when reference is made to a wafer or substrate in the following description, previous process steps may have been utilized to forms regions or junctions in the base semiconductor structure or foundation. When referring to aqueous solutions described herein, the term "percent" refers to the percent measured by weight, e.g., a 90% sulfuric acid solution is 90% by weight sulfuric acid. The following detailed description is, therefore, not to be taken in a limiting sense, and the scope of the present invention is defined by the appended claims.

Figure 1:
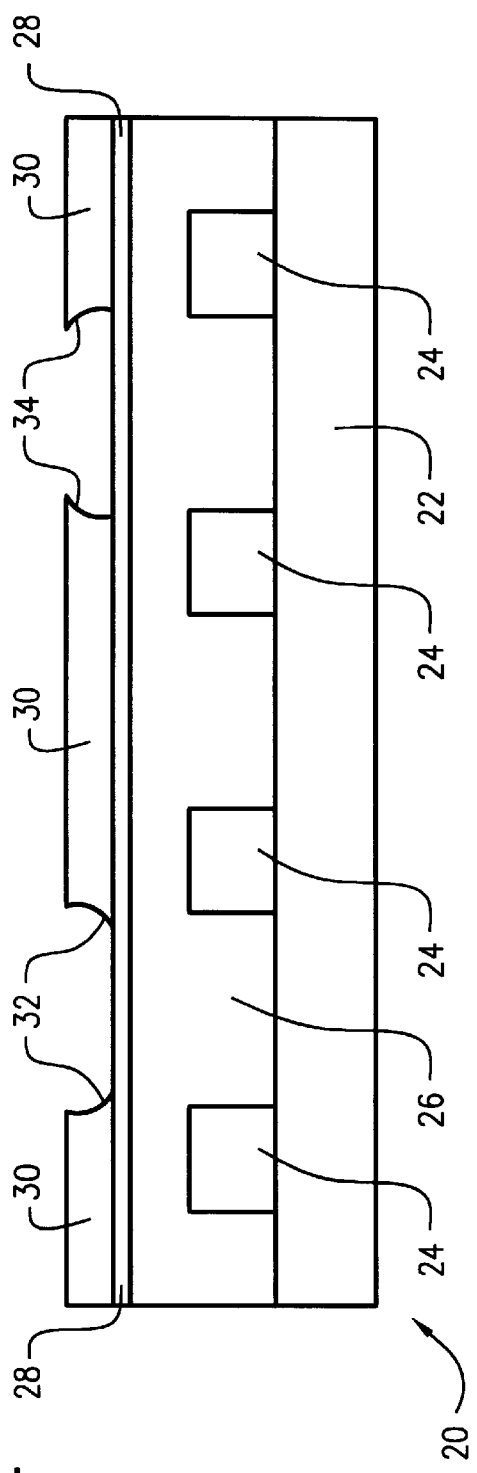
FIG. 1 is a diagrammatic cross-sectional view of a semiconductor wafer of the prior art depicting resist profile defects.

Referring now to the drawings, where like elements are designated by like reference numerals, FIG. 1 depicts a semiconductor wafer 20 in an intermediate processing stage of a prior art fabrication process. The wafer 20 comprises a silicon substrate 22 with devices 24 located thereon. The devices 24 are covered by a first layer 26 of material to be etched after the photoresist of the present invention is formed. The first layer 26 may be borophosphosilicate glass (BPSG) or other suitable material. Two layers are present on top of the first layer 26: an organic or inorganic anti-reflective coating 28, and a chemically amplified (CA) photoresist layer 30. The ARC layer 28 prevents DUV light from reflecting off the first layer 26/20/24 and overexposing the CA photoresist layer 30. The CA photoresist layer 30 has been exposed to DUV light, and due to contamination, exhibits resist footing 32 and T-topping 34 defects in the resist profile.

Figure 2:
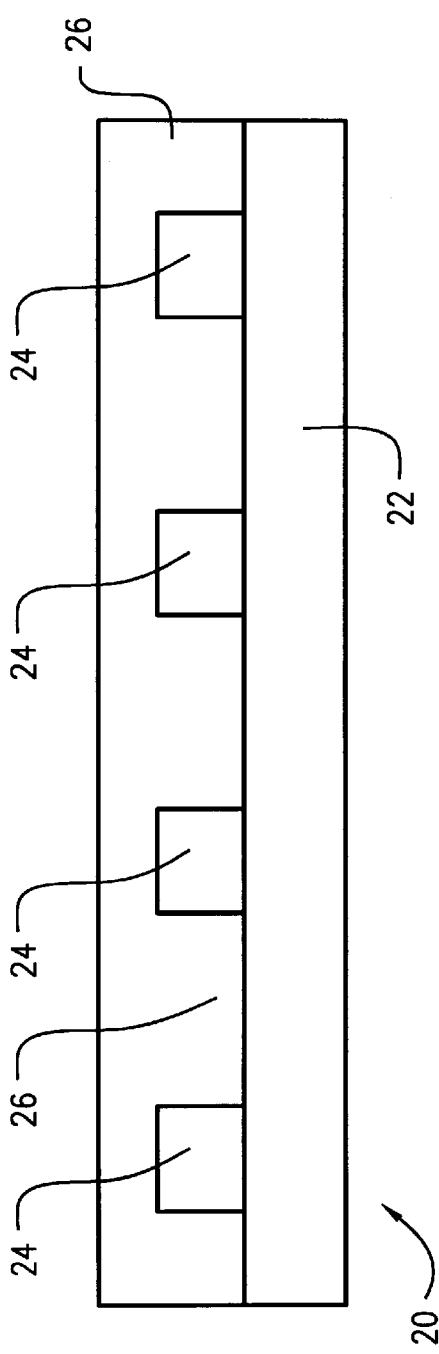
FIG. 2 is a diagrammatic cross-sectional view of a semiconductor wafer undergoing the process of a preferred embodiment of the invention.
Figure 3:
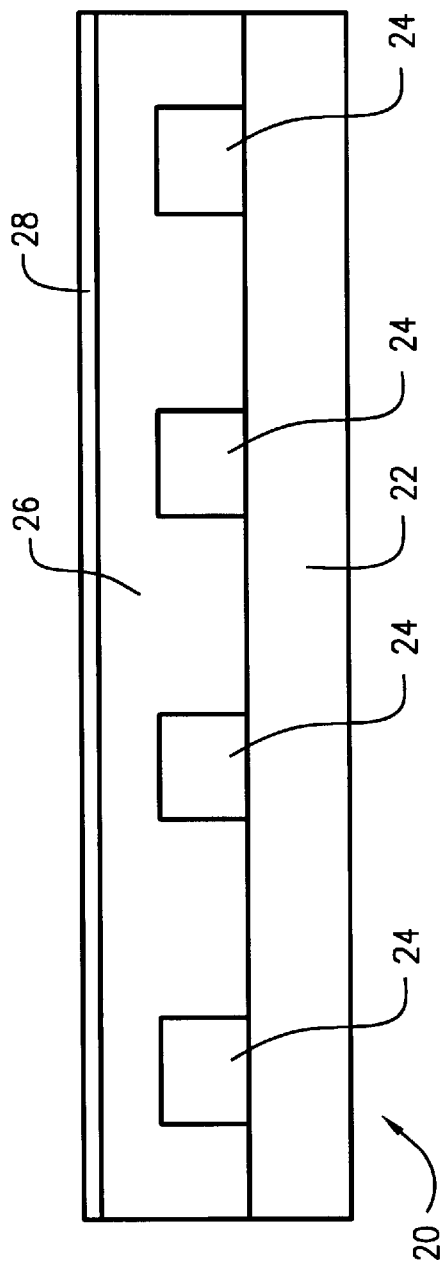
FIG. 3 shows the wafer of FIG. 2 at a processing step subsequent to that shown in FIG. 2.
Figure 4:
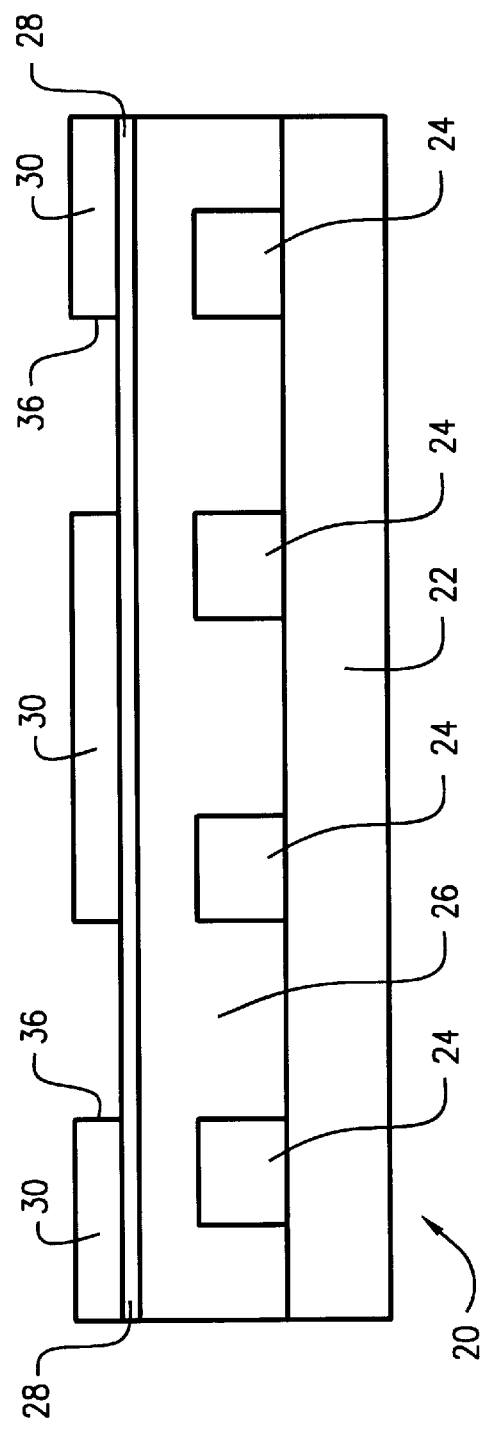
FIG. 4 shows the wafer of FIG. 2 at a processing step subsequent to that shown in FIG. 3.

An embodiment of the present invention for reducing resist profile defects is illustrated by FIGS. 2 through 4. This embodiment uses a cleansing agent called "piranha" or Caro's acid to cleanse the surface of an anti-reflective coating prior to the formation of a CA photoresist layer thereon. The cleansing agent is a solution of peroxysulfuric acid (also called persulfuric acid) or sulfuric acid and an oxidizing agent, and it is used at an elevated temperature.

Referring to FIG. 2, tie process of the present invention begins subsequent to the formation of devices 24, which may be transistors, capacitors, word lines, bit lines or the like, on a silicon substrate 22 of a silicon wafer 20, and the formation of a first layer 26 which will be etched using the photoresist produced by the present process. The first layer 26 may be a dielectric material, such as borophosphosilicate glass (BPSG), phosphosilicate glass (PSG), borosilicate glass (BSG), or silicon dioxide, and may be deposited by chemical vapor deposition or other suitable means.

FIG. 3 depicts the first step of the process, in which an anti-reflective coating 28 is formed on the top surface of the first layer 26. The coating 28 may be silicon rich oxide, silicon rich oxynitride, silicon rich nitride, or another material suitable for use to reduce light reflection from the substrate surface into the resist during photolithography. Inorganic or organic anti-reflective coatings may be used, however the process of the present invention is intended for use primarily with inorganic anti-reflective coatings, which are preferred, because of the lesser contamination levels found than organic anti-reflective coatings. A suitable means of forming the anti-reflective coating 28 is to spin it onto the surface of the first layer 26, or to otherwise deposit it in place.

After formation of the anti-reflective coating 28, the silicon wafer 20 is then subjected to the cleansing process of the present invention. The anti-reflective coating 28 is exposed to a cleansing etchant by suitable wet processing means, such as immersion of the wafer 20 into an etchant bath, or by spraying the etchant onto the anti-reflective coating 28, or by applying the cleansing etchant as a vapor. The anti-reflective coating 28 is exposed to the cleansing etchant at an elevated temperature for a time sufficient to remove nitrogen-containing contaminants from the anti-reflective coating 28. The wafer 20 may then be rinsed with deionized water, and spin-dried.

As shown in FIG. 4, a CA photoresist layer 30 is then formed by suitable means, such as by spinning it onto the surface of the anti-reflective coating 28. The photoresist 30 is patterned and developed, yielding a patterned photoresist with a vertical and substantially defect-free profile 36, with virtually no resist footing. The final structure of the silicon wafer 20 with the improved defect-free photoresist 30 is shown in FIG. 4. Further steps to utilize the improved photoresist 30 as a pattern, and to create a functional circuit from the wafer 20 may now be carried out.

The cleansing etchant is an aqueous solution of peroxysulfuric acid ($H_2SO_5$) or sulfuric acid ($H_2SO_4$) and an oxidizing agent. The oxidizing agent may be any strong oxidizer such as hydrogen peroxide, ammonium persulfate, potassium persulfate, or the like. Peroxysulfuric acid or sulfuric acid is used at a concentration of approximately 90 to 99 percent in an aqueous solution. The oxidizing agent is added in a small amount of approximately one percent or less, for example, approximately 100 mL of hydrogen peroxide per 30 L of sulfuric acid.

Cleansing is preferably performed at an elevated temperature within the range of approximately 70 to 150 degrees Celsius, for a time within the range of 5 to 50 minutes. More preferably the temperature of the cleansing etchant is within the range of approximately 115 to 135 degrees Celsius, and the etching process has a duration of approximately 15 to 25 minutes. Most preferably the temperature of the cleansing etchant is 125 degrees Celsius, and the etching process has a duration of approximately 20 minutes.

If peroxysulfuric acid is used, it is heated to the desired temperature by suitable heating means such as by heating the acid on a hot plate, by wrapping heating elements around the acid tank, or by placing an immersion heater in the tank. If a solution of sulfuric acid and an oxidizing agent is used, the sulfuric acid is heated to the desired temperature, and small amounts (e.g., 50 to 100 mL) of oxidizing agent are added before each cleansing step. Alternatively, a larger amount of oxidizing agent may be added to room temperature sulfuric acid, and the resultant exothermic reaction will raise the temperature of the solution to the desired 110 to 130 degree range. However, this second method requires continual recharging with fresh oxidizing agent to keep the reaction proceeding, and eventually the cleaning rate is lowered because excess water is produced as a reaction byproduct.

As can be seen by the embodiments described herein, the present invention encompasses processes of cleaning an anti-reflective coating prior to the formation of a photoresist layer thereon. The cleaning occurs by application of a cleansing etchant to the anti-reflective coating to remove nitrogen-containing contaminants which may react adversely with chemically-amplified photoresist. Removal of the contaminants results in CA photoresists having improved vertical profiles that are substantially free from defects such as resist footing.

The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A method of forming a patterned photoresist layer on a semiconductor wafer comprising the steps of:
   providing a semiconductor wafer having a silicon substrate and a first layer formed over said substrate;
   forming an anti-reflective coating over said first layer;
   exposing said anti-reflective coating to a cleansing etchant and then forming a photoresist layer in contact with said anti-reflective coating; and
   patterning and developing said photoresist layer to form a patterned photoresist layer with a vertical profile.

2. The method of claim 1, wherein the first layer is selected from the group consisting of borophosphosilicate glass, phosphosilicate glass, borosilicate glass, and silicon dioxide.

3. The method of claim 1, wherein the anti-reflective coating is selected from the group consisting of silicon rich oxide, silicon rich oxynitride, and silicon rich nitride.

4. The method of claim 1, wherein the cleansing etchant comprises an aqueous solution of sulfuric acid and an oxidizing agent.

5. The method of claim 4, wherein the aqueous solution comprises approximately 90 to 99 percent sulfuric acid.

6. The method of claim 4, wherein the aqueous solution comprises approximately 95 to 99 percent sulfuric acid.

7. The method of claim 4, wherein the oxidizing agent is hydrogen peroxide.

8. The method of claim 4, wherein the oxidizing agent is ammonium persulfate.

9. The method of claim 4, wherein the oxidizing agent is potassium persulfate.

10. The method of claim 1, wherein the cleansing etchant comprises peroxysulfuric acid.

11. The method of claim 1, wherein the step of exposing the anti-reflective coating to a cleansing etchant is performed at a temperature within the range of approximately 70 to 150 degrees Celsius.

12. The method of claim 1, wherein the step of exposing the anti-reflective coating to a cleansing etchant is performed at a temperature within the range of approximately 115 to 135 degrees Celsius.

13. The method of claim 1, wherein the step of exposing the anti-reflective coating to a cleansing etchant is performed at a temperature of approximately 125 degrees Celsius.

14. The method of claim 1, wherein the step of exposing the anti-reflective coating to a cleansing etchant further comprises immersion of the semiconductor wafer in said cleansing etchant.

15. The method of claim 1, wherein the step of exposing the anti-reflective coating to a cleansing etchant further comprises spraying said cleansing etchant onto the semiconductor wafer.

16. The method of claim 1, wherein the step of exposing tie anti-reflective coating to a cleansing etchant is performed for a time sufficient to remove substantially all nitrogen-containing contaminants from a top surface of said anti-reflective coating.

17. A method of cleaning a semiconductor wafer prior to the formation of a photoresist layer comprising the steps of:
providing a semiconductor wafer having a first layer formed over said wafer;
forming an anti-reflective coating over said first layer; and
cleaning said anti-reflective coating with a solution of sulfuric acid and then forming a patterned photoresist layer in contact with said anti-reflective coating, said patterned photoresist layer having a vertical profile.

18. The method of claim 17, wherein the first layer is selected from the group consisting of borophosphosilicate glass, phosphosilicate glass, borosilicate glass, and silicon dioxide.

19. The method of claim 17, wherein the anti-reflective coating is selected from the group consisting of silicon rich oxide, silicon rich oxynitride, and silicon rich nitride.

20. The method of claim 17, wherein the solution of sulfuric acid comprises approximately 90 to 99 percent sulfuric acid, and less than approximately 1 percent oxidizing agent.

21. The method of claim 20, wherein the oxidizing agent is hydrogen peroxide.

22. The method of claim 20, wherein the oxidizing agent is ammonium persulfate.

23. The method of claim 20, wherein the oxidizing agent is potassium persulfate.

24. The method of claim 17, wherein the solution of sulfuric acid comprises approximately 95 to 99 percent sulfuric acid, and less than approximately 1 percent oxidizing agent.

25. The method of claim 17, wherein the solution of sulfuric acid comprises an aqueous solution of Caro's acid.

26. The method of claim 17, wherein the step of cleaning said anti-reflective coating is performed at a temperature within the range of approximately 70 to 150 degrees Celsius.

27. The method of claim 26, wherein the step of cleaning said anti-reflective coating is performed for a time within the range of 5 to 50 minutes.

28. The method of claim 17, wherein the step of cleaning said anti-reflective coating is performed at a temperature within the range of approximately 120 to 130 degrees Celsius.

29. The method of claim 28, wherein the step of cleaning said anti-reflective coating is performed for a time within the range of 15 to 25 minutes.

30. The method of claim 17, wherein the step of cleaning said anti-reflective coating is performed at a temperature of approximately 125 degrees Celsius.

31. The method of claim 30, wherein the step of cleaning said anti-reflective coating is performed for a time of approximately 20 minutes.

32. The method of claim 17, wherein the step of cleaning said anti-reflective coating further comprises immersion of the semiconductor wafer in said solution.

33. The method of claim 17, wherein the step of cleaning said anti-reflective coating further comprises spraying said solution onto the anti-reflective coating.

34. A method of forming a chemically amplified photoresist layer on a semiconductor wafer comprising the steps of:
providing a semiconductor wafer having a first layer formed over said wafer;
forming an anti-reflective coating over said first layer; and
exposing said anti-reflective coating to a mixture of sulfuric acid and hydrogen peroxide at a temperature within the range of approximately 70 to 150 degrees Celsius and then forming a chemically amplified photoresist layer in contact with said anti-reflective coating.

35. The method of claim 34, wherein the first layer is selected from the group consisting of borophosphosilicate glass, phosphosilicate glass, borosilicate glass, and silicon dioxide.

36. The method of claim 34, wherein the anti-reflective coating is selected from the group consisting of silicon rich oxide, silicon rich oxynitride, and silicon rich nitride.

37. The method of claim 34, wherein the mixture of sulfuric acid and hydrogen peroxide comprises approximately 90 to 99 percent sulfuric acid, and less than approximately 1 percent hydrogen peroxide.

38. The method of claim 34, wherein the mixture of sulfuric acid and hydrogen peroxide comprises approximately 95 to 99 percent sulfuric acid, and less than approximately 1 percent hydrogen peroxide.

39. The method of claim 34, wherein the temperature is within the range of approximately 115 to 135 degrees Celsius.

40. The method of claim 34, wherein the temperature is approximately 125 degrees Celsius.

41. The method of claim 34, wherein the step of exposing said anti-reflective coating to the mixture further comprises immersion of the semiconductor wafer in said mixture.

42. The method of claim 34, wherein the step of exposing said anti-reflective coating to the mixture further comprises spraying said mixture onto the anti-reflective coating.

43. A method of forming a patterned photoresist layer on a semiconductor wafer comprising the steps of:

provisioning a semiconductor wafer having a borophosphosilicate glass layer formed over said wafer;

forming an anti-reflective coating over the borophosphosilicate glass layer; immersing the wafer in an aqueous solution comprising 95 to 99 percent sulfuric acid and less than 1 percent hydrogen peroxide for a time sufficient to remove substantially all nitrogen-containing contaminants from a top surface of said anti-reflective coating, and wherein said aqueous solution is at a temperature of approximately 125 degrees Celsius; and forming a patterned photoresist layer in contact with said anti-reflective coating, said patterned photoresist layer having a vertical profile.

\* \* \* \* \*